US007230477B2

(12) United States Patent
Mizuno et al.

(10) Patent No.: US 7,230,477 B2
(45) Date of Patent: Jun. 12, 2007

(54) SEMICONDUCTOR INTEGRATED CIRCUIT DEVICE

(75) Inventors: Hiroyuki Mizuno, Musashino (JP); Yusuke Kanno, Hachioji (JP); Kazumasa Yanagisawa, Kokubunji (JP); Yohihiko Yasu, Kodaira (JP); Nobuhiro Oodaira, Akishima (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/296,442

(22) Filed: Dec. 8, 2005

(65) Prior Publication Data

US 2006/0091942 A1    May 4, 2006

Related U.S. Application Data

(60) Continuation of application No. 11/040,033, filed on Jan. 24, 2005, now abandoned, which is a division of application No. 10/351,320, filed on Jan. 27, 2003, now Pat. No. 6,888,395.

(30) Foreign Application Priority Data

Jan. 28, 2002    (JP) ............................ P2002-017838

(51) Int. Cl.
*H01L 2/00* (2006.01)
(52) U.S. Cl. .................................... 327/565
(58) Field of Classification Search ......... 327/564–566
See application file for complete search history.

(56) References Cited

U.S. PATENT DOCUMENTS 5,019,727 A    5/1991  Kusaba ..................... 326/108

6,107,869 A    8/2000  Horiguchi et al. .......... 327/544
6,373,285 B1   4/2002  Konishi ....................... 326/81
6,518,835 B2 * 2/2003  Riho et al. .................. 327/565
6,577,153 B2   6/2003  Kodama ...................... 326/27

FOREIGN PATENT DOCUMENTS

JP    2002-026711    1/2002

OTHER PUBLICATIONS

M.J. Flynn et al, "Deep-Submicron Microprocessor Design Issues", IEEE MICRO, Jul.-Aug. 1999, pp. 11-12.
J.M. Soden et al, "Identifying Defects in Deep-Submicron CMOS ICs", IEEE SPECTRUM, Sep. 1996, pp. 66-71.

* cited by examiner

*Primary Examiner*—Quan Tra
(74) *Attorney, Agent, or Firm*—Mattingly, Stanger, Malur & Brundidge, P.C.

(57) ABSTRACT

A semiconductor integrated circuit device provided with a first circuit block BLK1, a second circuit block DRV1 and a conversion circuit MIO1 for connecting the first circuit block to the second circuit block. The first circuit block includes a first mode for applying a supply voltage and a second mode for shutting off the supply voltage. The conversion circuit is provided with a function for maintaining the potential of an input node of the second circuit block at an operation potential, thereby suppressing a penetrating current flow when the first circuit block is in the second mode. The conversion circuit (MIO1 to MIO4) are commonly used for connecting circuit blocks.

3 Claims, 14 Drawing Sheets

F I G. 1 0

| (d1, e, cs, cr) | | RCV | | |
|---|---|---|---|---|
| | | ON | OFF1 | OFF2 |
| SND | ON | (−, H, H, H) | (*, *, H, L) | (*, *, H, *) |
| | OFF1 | (*, −, L, H) | (*, *, L, L) | (*, *, L, *) |
| | OFF2 | (*, L, *, H) | (*, *, *, L) | (*, *, *, *) |

F I G. 1 5
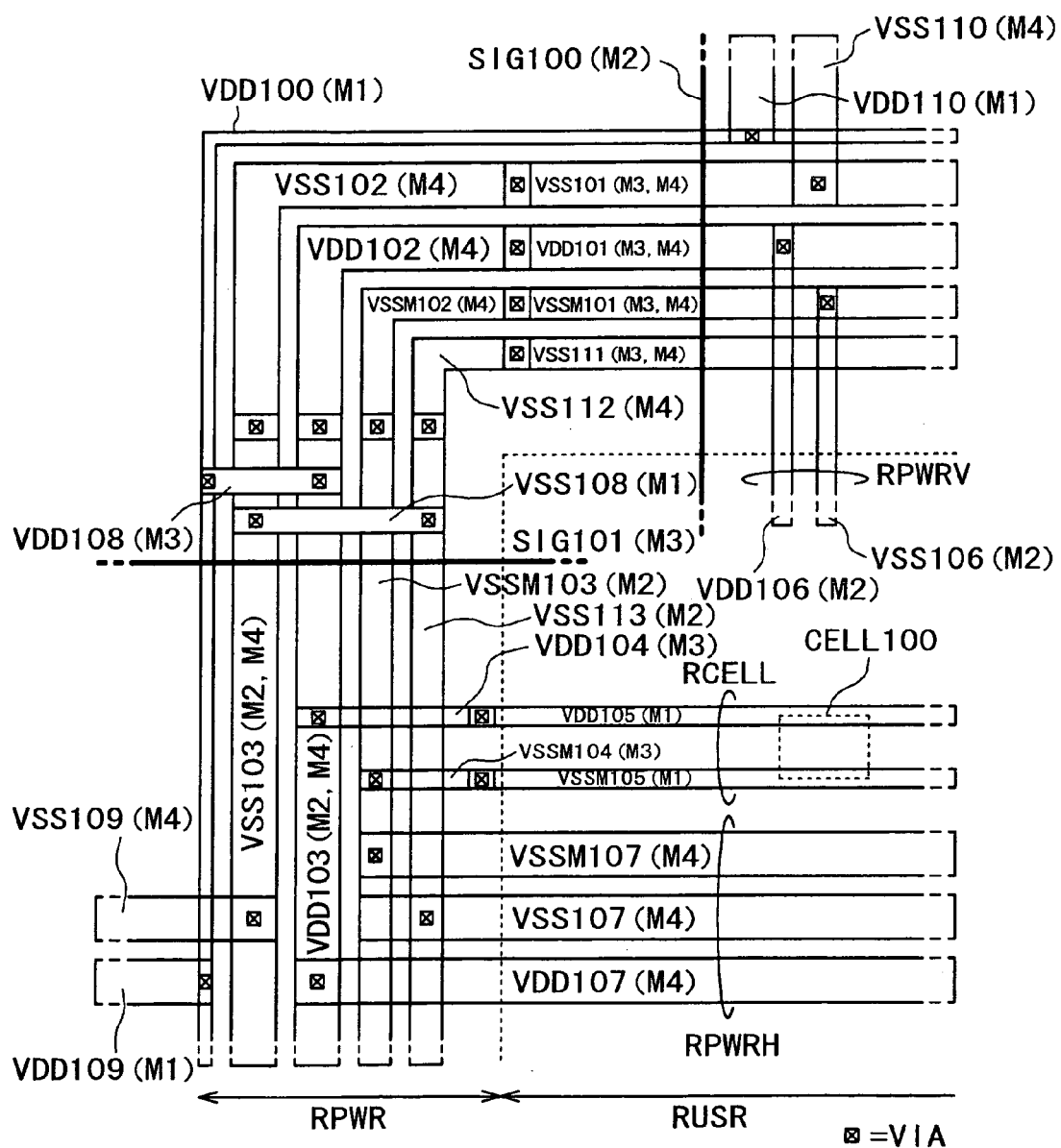

SEMICONDUCTOR INTEGRATED CIRCUIT DEVICE

This is a continuation application of U.S. Ser. No. 11/040,033, filed Jan. 24, 2005, now abandoned which is a divisional application of U.S. Ser. No. 10/351,320, filed Jan. 27, 2003 (now U.S. Pat. No. 6,888,395).

BACKGROUND OF THE INVENTION

1. Field of the Invention

The present invention relates to a semiconductor integrated circuit device, particularly to a semiconductor integrated circuit device that operates at a high-speed and yet is energy efficient.

2. Description of the Related Art

A fine microelectronic fabrication technique (fine-fabrication, hereafter) is widely employed in processing chips in order to integrate many functions on a single chip, as described in "Deep-Submicron Microprocessor Design Issues", IEEE Micro, pp. 11–22, July/August, 1999. This fine-fabrication enables many MOS transistors to be integrated on a chip, thereby providing the chip with many functions.

To efficiently integrate many circuits on a chip with fewer defects, however, demands many number of man-hours, namely a long period for developing a plan for such chip. To the contrary, in order to shorten the development period by increasing the number of man-hours causes a shortage of human resources required for designing, thereby causing a bottleneck in designing other types of chips. To solve this dilemma, diversion of developed circuit blocks to other types of chips has been examined.

On the other hand, it is well known that a leakage current (the leakage current includes a sub-threshold leakage current, a gate tunnel leakage current and junction leakage currents such as a GIDL (Gate-Induced Drain Leakage) current) increases due to the fine-fabrication of chip processes. This is described in "Identifying defects in deep-submission CMOS ICs" IEEE Spectrum, pp. 66–71, 1996. Those leakage currents cause the power consumption of a chip to increase. Controlling the supply voltage of a circuit block in its standby state enables the power consumption to be reduced.

Shutting off the supply voltage to the circuit block in the standby state, however, allows the circuit block output node to go into a floating state, causing a penetrating current (short circuit current) to flow in another circuit block that receives the output from the output node. When the circuit block whose supply voltage is controllable is to also be used for another chip, an interface circuit must be designed so as to prevent penetrating currents. This might be an obstacle for re-use of low power-driven circuit blocks.

SUMMARY OF THE INVENTION

An object of the present invention is to provide a semiconductor integrated circuit device that solves the above-mentioned problems.

In order to achieve this object, one aspect of the present invention is directed to a semiconductor integrated circuit device that includes a first circuit block, a second circuit block, and a conversion circuit for connecting the first circuit block to the second circuit block, the first circuit block having a first mode for receiving a supply voltage and a second mode for shutting off the supply voltage, wherein when the first circuit block is in the second mode, the conversion circuit controls the potential of an input node of the second circuit block to any of the operating potentials of the second circuit block. In particular, the conversion circuit, which is provided with a common power supply control interface, connects each circuit block to another through itself.

In another aspect, the semiconductor integrated circuit device provided a power line around each circuit block and disposes a power controlling circuit properly in an area where the power line is disposed.

These and other objects, features and advantages of the present invention will become more apparent in light of the following description.

BRIEF DESCRIPTION OF THE DRAWINGS

FIG. 10 is a chart for describing a relationship between input/output signals to/from the micro-scale I/O circuit shown in FIG. 9;

FIG. 15 illustrates a power supply network of a circuit block;

DETAILED DESCRIPTION OF THE PREFERRED EMBODIMENTS

<Embodiment 1>

Figure 1:
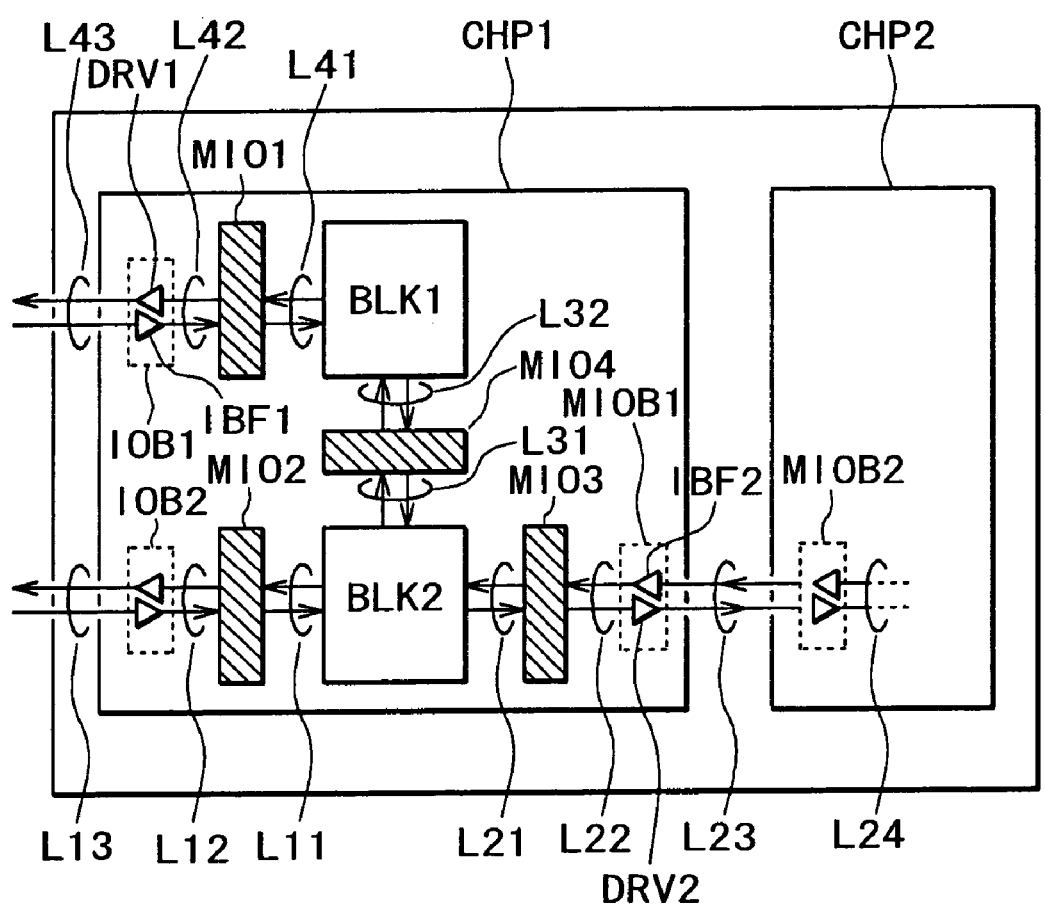
FIG. 1 is a block diagram of a semiconductor integrated circuit device of a basic embodiment of the present invention.

FIG. 1 shows a basic block diagram of the semiconductor integrated circuit device of the present invention. Each of circuit blocks BLK1 and BLK2 includes one or more MOS transistors. In this specification, "MOS transistor" is used as generic term for insulated gate field effect transistor but not limited thereto. The circuit block BLK should preferably be composed as a CMOS circuit in which P-type and N-type MOS transistors are connected in series. The supply voltage of the circuit block BLK1 is controlled so as to reduce a leakage current independently of the state of the power to the whole chip CHP1 (the circuit block BLK2 may also be controlled). The configuration of each micro-scale I/O circuit MIO1 to MIO4 is specific to the present invention. The details of the configuration will be described later. An I/O buffer IOB1 is configured by a low impedance output driver circuit DRV1 used to drive a large load capacitance outside a module MDL1, an input buffer circuit IBF1 having an electrostatic discharge (ESD) protection element, and other elements. An I/O buffer IOB2 also has the same configuration as I/O buffer IOB1. The I/O buffer MIOB1 is configured by an output driver circuit DRV2 having a low impedance (higher than the output impedance of the output driver circuit DRV1 of the I/O buffer IOB1) used to drive a comparatively large load capacitance outside the chip CHP1 within the module MDL1, an input buffer circuit IBF2 provided with an electrostatic discharge (ESC) protection element as needed, and other elements. An I/O buffer MIOB2 also has the same configuration with the I/O buffer MIOB1. In this specification, an I/O buffer used for the connection between chips in a module will be referred to as a "mini-scale I/O buffer" when it is distinguished from an I/O buffer used for the connection between modules. Reference symbols L11 to L13, L21 to L24, L31 to L32, and L41 to L43 denote signal lines.

A chip is a semiconductor integrated circuit device that employs one semiconductor substrate. A module is a semiconductor circuit device configured by one or plurality of chips. Examples of the module are, for example, a stacked CSP (Chip Scale Package) and an MCP (Multi Chip Package) in which a plurality of chips are mounted in one package. An MCM (Multi Chip Module) and a SIMM (Single Inline Memory Module) used widely as dynamic memories are other examples of the module, in which a plurality of packages are mounted on one printed board.

A signal line group L41 is connected to the I/O buffer IOB1 through a signal line group L42 and a micro-scale I/O circuit MIO1. The signal line group L41 is eventually connected to a device outside a module MSL1 through a signal line group L43. A signal line group L32 is connected to the circuit block BLK2 through a micro-scale I/O circuit MIO4 and a signal line group L31. A signal line group L11 is connected to the I/O buffer IOB2 through a micro-scale I/O circuit MIO2 and a signal line group L12. The signal line group L11 is eventually connected to a device outside the module MSL1 through a signal line group L13. A signal line group L21 is connected to a mini-scale I/O buffer MIOB1 through a micro-scale I/O circuit MIO3 and a signal line group L22. The signal line group L21 is eventually connected to a mini-scale I/O buffer MIOB2 located in the chip CHP2 in the same module as the chip CHP1 through a signal line group L23.

Each of the signal line groups L11, L12, L21, L22, L31, L32, L41 and L42 includes signal lines specific to the corresponding circuit (circuit block BLK or I/O buffer IOB(MIOB)) and power control interface signal lines, respectively. Although not limited specifically, data signal lines and address signal lines are included as the signal lines of the signal line groups. Details of each power control interface signal lines will be described later.

Figure 2:
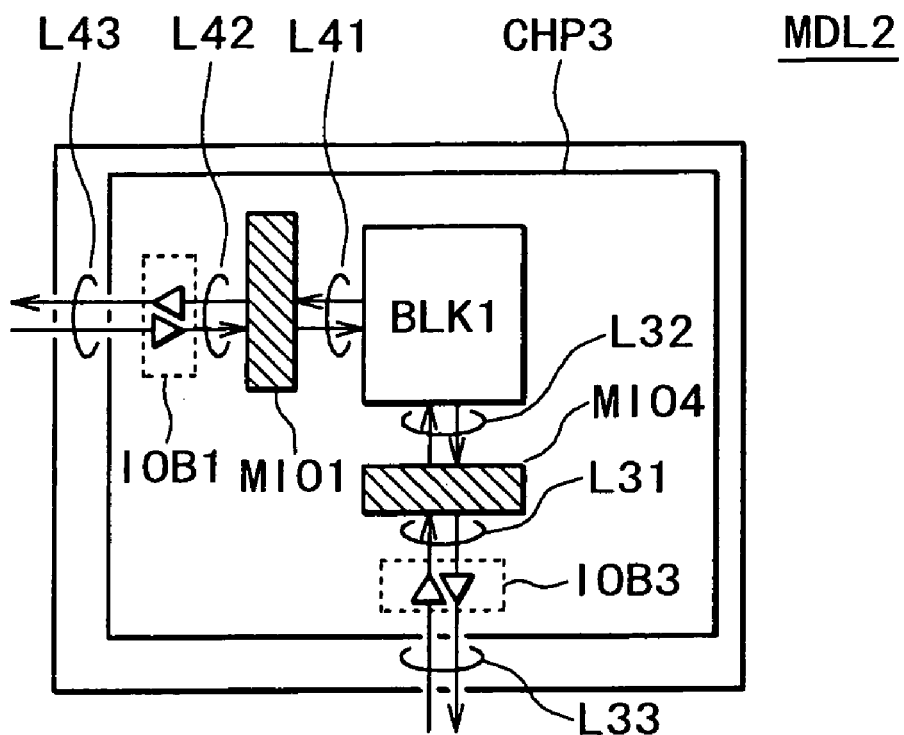
FIG. 2 is another block diagram of the semiconductor integrated circuit device of the present invention.

FIG. 2 shows another block diagram of the semiconductor integrated circuit device of the present invention. Circuit block BLK1 is the same in function as the circuit block BLK1 shown in FIG. 1. Reference symbols MIO1 and MIO4 denote micro-scale I/O circuits and reference symbols IOB1 and IOB3 denote I/O buffers. Reference symbols CHP3 and MDL2 denote a chip and a module, respectively. A signal line group L41 is connected to an I/O buffer IOB1 through a signal line group L42 and a micro-scale I/O circuit MIO1. And the micro-scale I/O circuit MIO1 is connected to a device outside the module MDL2 through a signal line group L43. A signal line group L32 is connected to an I/O buffer IOB3 through a signal line group L31 and a micro-scale I/O circuit MIO4. And the I/O buffer IOB3 is connected to a device outside the module MDL2 through a signal line group L33.

According to the present invention, each circuit block communicates with external circuit blocks through micro-scale I/O circuits. Namely, in any of the block diagrams shown in FIGS. 1 and 2, the block BLK1 is connected to a micro-scale I/O circuit. In consequence, the same circuit block BLK1 can be used to configure another chip/module with no modification of the interface specifications related to power control. Accordingly, the number of man-hours for development of modules can be reduced significantly. This is effective even though the fineness of fabrication is different between the chip CHP1 shown in FIG. 1 and the chip CHP3 shown in FIG. 2, because most of the necessary modifications of a circuit block are due to a modification of fabrication.

For example, the circuit block BLK1 is assumed to have been developed for the chip CHP3 shown in FIG. 2 fabricated in 0.18 μm CMOS processes. The circuit block BLK1 is assumed to be used for the chip CHP1 shown in FIG. 1 fabricated in 0.13 μm CMOS processes. This change of fineness of fabrication increases the number of circuits to be integrated in a chip more than before, consequently enabling both circuit blocks BLK1 and BLK2 to be mounted on the chip CHP1. In this case, however, any additional development for power control interface does not emerge. Therefore, the existing power control interface can be used for the circuit block, because each circuit block is connected to another circuit block through a micro-scale I/O circuit, even when an existing circuit block is diverted to another chip to develop a new chip. This can minimize the modification of the circuit block to be required to cope with the fine-fabrication.

Furthermore, the circuit block might come to communicate with a different destination through the micro-scale I/O circuit, when the circuit block is diverted to another chip. For example, the connected destination of the signal line group L31 differs between FIGS. 1 and 2. In FIG. 2, the signal line group L32 is connected finally to a device outside the module MDL2 through the signal line group L31. In FIG. 1, however, the signal line group L32 is connected finally to the circuit block BLK2 on the same chip CHP1 through the signal line group L31. This means that a circuit block, when coming communicating with a different destination, can cope with the modified configuration only by connecting an I/O buffer, a mini-scale I/O buffer, or the like to the micro-scale I/O circuit.

For example, when a destination is in another chip in the same module, a mini-scale I/O buffer is preferable because this destination just requires to driving a comparatively small load capacitance for the communication. On the other hand, while a destination is in another module, an I/O buffer is preferable because this destination requires to driving a comparatively large load capacitance for the communication. Furthermore, when a destination is in the same chip, there is no need for the I/O buffer or mini-scale I/O buffer, and otherwise, may use a buffer having smaller driving ability than the mini-scale I/O buffer. The micro-scale I/O circuit enables a buffer to be selected freely according to the destination, thereby the interface operation is made faster and the interface power consumption is reduced significantly.

Figure 3:
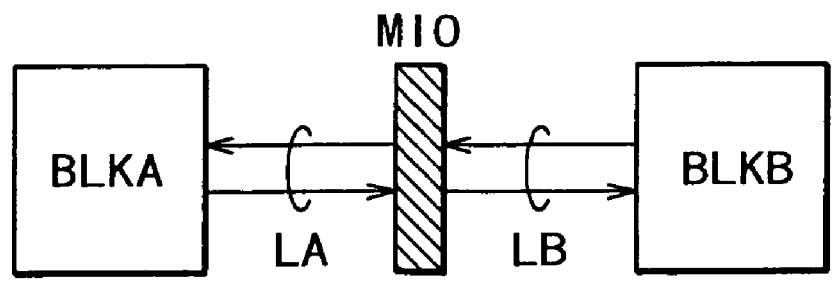
FIG. 3 is a basic block diagram of the semiconductor integrated circuit device of the present invention, which includes a micro-scale I/O circuit.

FIG. 3 shows a basic configuration of the semiconductor integrated circuit device of the present invention. Circuit blocks BLKA and BLKB are connected to each other through signal line groups LA and LB, as well as through a micro-scale I/O circuit MIO. Generally, a circuit block is defined as one that is configured by a group of circuits having functions and is desirable to possibly be used by many modules. An IP (Intellectual Property: a circuit for executing such functions as an arithmetic function, a signal control function, etc. provided for a semiconductor integrated circuit) supplied by a so-called IP provider also belongs to the circuit blocks.

A circuit block for which a micro-scale I/O circuit of the present invention should preferably be used is a unit grouped for a power supply controlling. For example, the circuit block BLKA enables a power supply to be turned on/off independently of the state of the power to the whole chip. Where the circuit block BLKA power is turned off while the circuit block BLKB is turned on, the signal line from the circuit block BLKA to the circuit block BLKB goes into a floating state. In this case, assuming that the circuit blocks BLKA and BLKB are connected to each other, a penetrating current adversely flows in the powered circuit block BLKB. Using a micro-scale I/O circuit prevents the powered circuit block BLKB from the adverse state, caused by controlling the power for the circuit block BLKA.

In the above-mentioned example, the circuit block BLKB may also be formed so as to enable a power supply to be turned on/off independently of the state of power to the whole chip. The circuit blocks BLKA and BLKB may also operate on different supply voltages. Examples of such circuit blocks is: each of the I/O buffers IOB1, IOB2 and IOB3, as well as the mini-scale I/O buffers MIOB1 and MIOB2 shown in FIGS. 1 and 2.

According to the present invention, the micro-scale I/O circuit is used as an interface between the circuit blocks BLKA and BLKB. When the supply voltage differs between the circuit blocks BLKA and BLKB, signal amplitude conversion is required (level conversion, hereafter) between those BLKA and BLKB.

Figure 4:
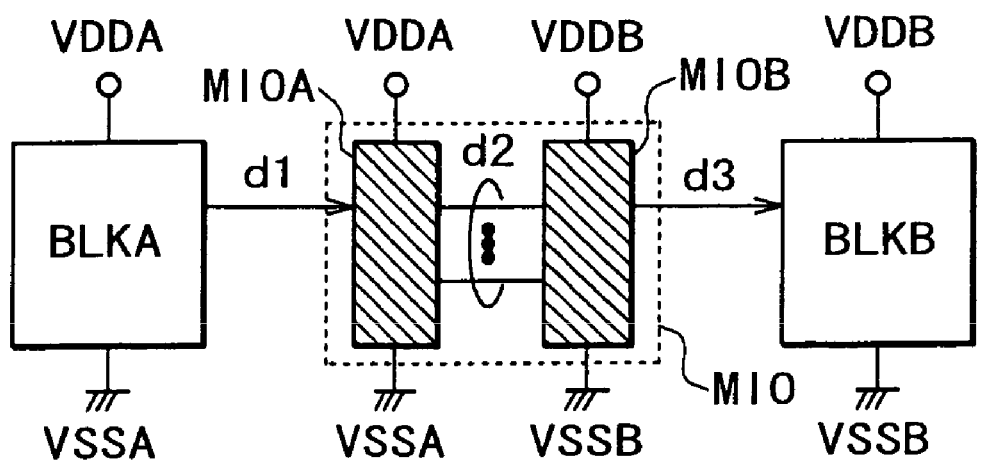
FIG. 4 is a block diagram of two circuit blocks that might have different supply voltages and micro-scale I/O circuit provided between those two circuit blocks.

FIG. 4 shows a basic block diagram of the semiconductor integrated circuit device of the present invention, which includes the micro-scale I/O circuit provided with a level conversion circuit. In FIG. 4, VDDA and VSSA respectively denote a power supply and a ground of the circuit block BLKA; VDDB and VSSB respectively denote a power supply and a ground of the circuit block BLKB. Note that, because a supply voltage to a circuit is defined by both a high potential and a low potential, in this embodiment, the power supply represents the high potential and the ground represents the low potential. The signal lines d1 and d3 represent one bit of the signal line group between the circuit blocks BLKA and BLKB, respectively. Signals from the sending side circuit block BLKA are output through the signal line d1 and inputted to the receiving side circuit block BLKB through the micro-scale I/O circuit MIO and the signal line d3. The micro-scale I/O circuit is configured by two circuits; the first stage of micro-scale I/O circuit MIOA driven between the power supply VDDA and the ground VSSA and the second stage of micro-scale I/O circuit MIOB driven between the power supply VDDB and the ground VSSB. The signal line d2 denotes a plurality of signal lines connected between the first stage of micro-scale I/O circuit MIOA and the second stage of micro-scale I/O circuit MIOB. The signal d1 having a signal amplitude (VDDA-VSSA) output from the circuit block BLKA is inputted to the first stage of micro-scale I/O circuit MIOA; the first stage of micro-scale I/O circuit MIOA inputs signals required for level conversion to the second stage of micro-scale I/O circuit MIOB through the signal line group d2; and the second stage of micro-scale I/O circuit MIOB converts the above signal to a signal having a signal amplitude (VDDB-VSSB) and inputs the result to the circuit block BLKB through the signal line d3.

This configuration makes it possible to supply an optimal supply voltage to each circuit block, thereby enabling high-speed and yet energy efficient operating characteristics. For example, a circuit block such as an I/O buffer, a mini-scale I/O buffer, a real time clock (RTC), an interrupt processing circuit, a DRAM refresh circuit and a low-speed and large capacity memory may be configured to receive a comparatively high supply voltage by using MOS transistors having a comparatively large absolute threshold voltage. This can suppress a DC current to effectively reduce the power consumption in the circuit block. For, the power consumption of these circuit blocks is mainly caused by such a DC current as a sub-threshold leakage current due to their comparatively low activation rate. On the other hand, a circuit block such as a CPU, an MPEG4 accelerator and a high-speed and small capacity memory may be configured to receive a comparatively low supply voltage by using MOS transistors having a comparatively small absolute threshold voltage. This can suppress a charging and discharging current to effectively reduce the power consumption of the circuit block. Thus, the power consumption is caused mainly by its charging and discharging current flowing while the circuit block is operating.

The threshold voltage and the gate insulator thickness of the MOS transistors in each circuit block may be configured to depend on the supply voltage and the operation speed of the circuit block. Note that the threshold voltage and the gate insulator thickness may be varied among chips or modules.

Both configuration and operation of a micro-scale I/O circuit will now be described, assuming that the supply voltage differs between the circuit blocks BLKA and BLKB as shown in FIG. 4. The normal operation of the micro-scale I/O circuit is assured when the micro-scale I/O circuit can shut off a penetrating current to be caused by a floating state signal input. There are the following four types of power supply shut-off patterns.

(1) The power supplies to both the sending side circuit block BLKA and the first stage of the micro-scale I/O circuit MIOA are shut off (the potential supply to the VDDA or VSSA is shut off). This state is referred to as the "first case of power control."

(2) The power supply to the receiving side circuit block BLKB is shut off (the potential supply to the VDDB or VSSB to the circuit block BLKB is shut off) while the power supply to the second stage of the micro-scale I/O circuit MIOB continues. This state is referred to as the "second case of power control."

(3) The power supply to the sending side circuit block BLKA is shut off (the potential supply to the VDDA or VSSA to the circuit block BLKA is shut off) while the power supply to the first stage of the micro-scale I/O circuit MIOA continues. This state is referred to as the "third case of power control."

(4) The power supplies to both of the receiving side circuit block BLKB and the second stage of the micro-scale I/O circuit MIOB are shut off (the potential supply to the VDDB or VSSB is shut off). This state is referred to as the "fourth case of power control."

In the fourth case of power control, the normal operation of the micro-scale I/O circuit is assured basically in the configuration shown in FIG. 4. This is because the power supplies to the receiving circuit block BLKB and the second stage of the micro-scale I/O circuit MIOB are shut off, thereby no penetrating current flows in the receiving side circuit block BLKB nor second stage of the micro-scale I/O circuit MIOB regardless of whether the power supply to the sending side circuit block BLKA continues or not. Hereinafter, a configuration of the micro-scale I/O circuit will be described. The following configuration supports the first to third cases of power control.

Figure 5:
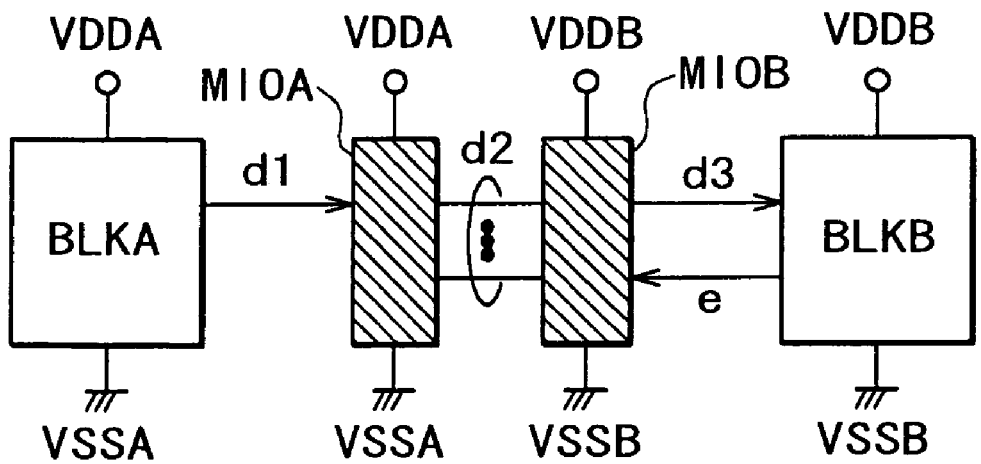
FIG. 5 is a block diagram of the micro-scale I/O circuit for enabling the normal operation in a first case of power control.

The configuration shown in FIG. 5 assures the normal operation of the micro-scale I/O circuit in the first case of power control. This first case of power control occurs, for example, when a voltage regulator that supplies a potential VDDA, VSSA, VDDB and VSSB to a chip stops supplying the potential VDDA or VSSA. In the configuration shown in FIG. 5, a signal e is inputted to the second stage of the micro-scale I/O circuit MIOB from the receiving side circuit block BLKB. In the first case of power control, power supply to the first stage of the micro-scale I/O circuit MIOA is shut off, so that the signal line group d2, which is output from the first stage of the micro-scale I/O circuit MIOA, goes into a floating state. The second stage of the micro-scale I/O circuit MIOB must thus be prevented from the penetrating current flow even when this floating state signal is inputted thereto.

To assure the normal operation of this micro-scale I/O circuit in FIG. 5, therefore, the above signal e is inputted to the second stage of the micro-scale I/O circuit MIOB. The circuit block BLKB is thus required to recognize the shut-off of the potential VDDA or VSSA. For example, the circuit block BLKB may include an item "potential VDDA or VSSA supply shut-off is notified" or an item "the chip includes a plurality of modes and the potential VDDA or VSSA shut-off in a special mode" in its specifications. In the latter case, when the chip goes into the special mode, the circuit block BLKB recognizes the shut-off of the potential VDDA or VSSA. Namely, the receiving side circuit block BLKB detects the shut-off of the power supply to the sending side circuit block BLKA and the first stage of the micro-scale I/O circuit MIOA and sends the signal e so as to enable normal operation of the micro-scale I/O circuit.

Figure 6:
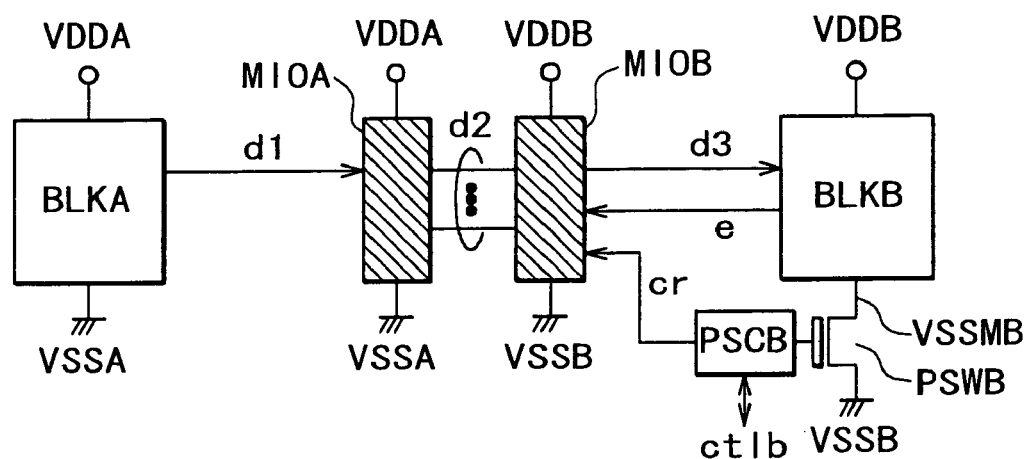
FIG. 6 is a block diagram of the micro-scale I/O for enabling the normal operation in first and second cases of power control.

The configuration shown in FIG. 6 assures the normal operation of the micro-scale I/O circuit not only in the first case of power control, but also in the second case of power control. The second case of power control occurs, for example, when the potential VDDB or VSSB supply to the circuit block BLKB is shut off while the voltage regulator continues the supply of the potential VDDB or VSSB. In the configuration shown in FIG. 6, the VDDB is supplied to the circuit block BLKB directly while the ground potential is supplied to the BLKB through the power switch PSWB. The power switch PSWB is turned on/off by the power switching controller circuit PSCB. The second case of power control occurs when the controller circuit PSCB turns off the power switch PSWB. When this second case of power control occurs, the signal line e goes into the floating state. When the controller circuit PSCB turns off the power switch PSWB, this power-off state is notified to the second stage of the micro-scale I/O circuit MIOB through the signal line cr. The second stage of the micro-scale I/O circuit MIOB, because it can detect the floating state of the signal line e through this signal cr, can operate the micro-scale I/O circuit normally.

Figure 7:
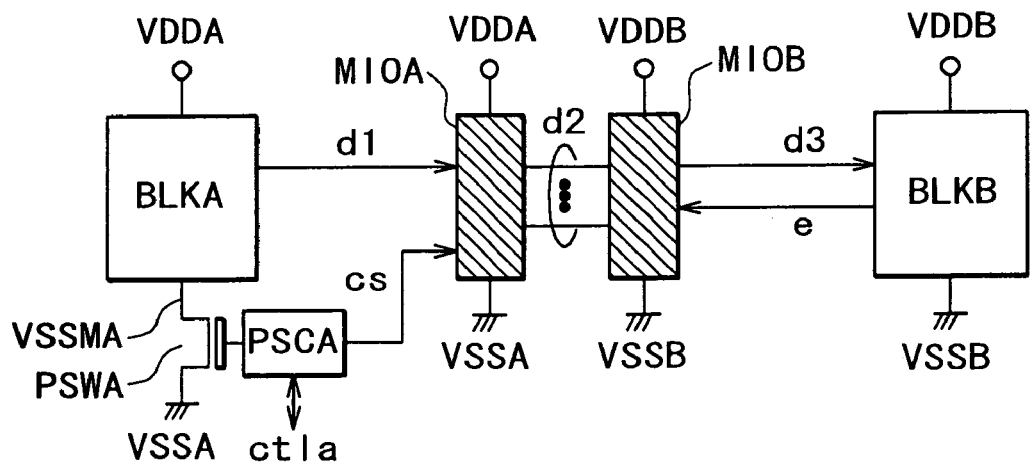
FIG. 7 is a block diagram of the micro-scale I/O circuit for enabling the normal operation in first and third cases of power control.

The configuration shown in FIG. 7 assures the normal operation of the micro-scale I/O circuit not only in the first case of power control, but also in the third case of power control. The third case of power control occurs, for example, when the potential VDDA or VSSA supply to the circuit block BLKA is shut off while the voltage regulator continues the supply of the potential VDDA or VSSA. In the configuration shown in FIG. 7, the VDDA is supplied to the circuit block BLKA directly while the ground potential VSSA is supplied to the BLKA through the power switch PSWA. The power switch PSWA is turned on/off by the power switching controller circuit PSCA.

The third case of power control occurs when the controller circuit PSCA turns off the power switch PSWA. When this third case of power control occurs, the signal line d1 goes into a floating state. When the controller circuit PSCA turns off the power switch PSWA, this power-off state is notified to the first stage of the micro-scale I/O circuit MIOA through the signal line cs. The first stage of the micro-scale I/O circuit MIOA, because it can detect the floating state of the signal line d1 through this signal line cs, can operate the micro-scale I/O circuit normally.

Figure 8:
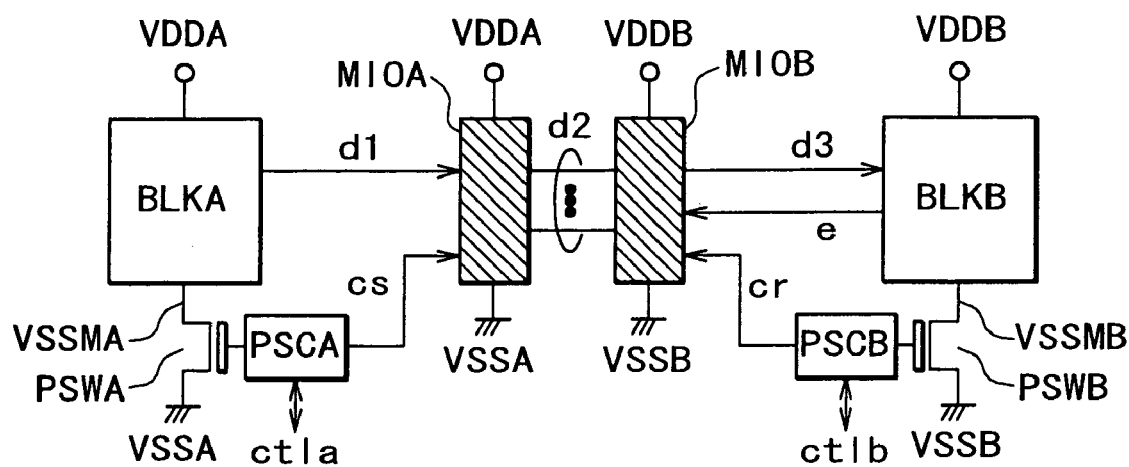
FIG. 8 is a block diagram of the micro-scale I/O circuit for enabling the normal operation in first, second, and third cases of power control.

FIG. 8 shows a configuration of the micro-scale I/O circuit for assuring the above normal operation even in the first, second, and third cases of power control. This configuration may be a combination of those shown in FIGS. 6 and 7. Therefore, description for details of this combination will be omitted here.

Figure 9:
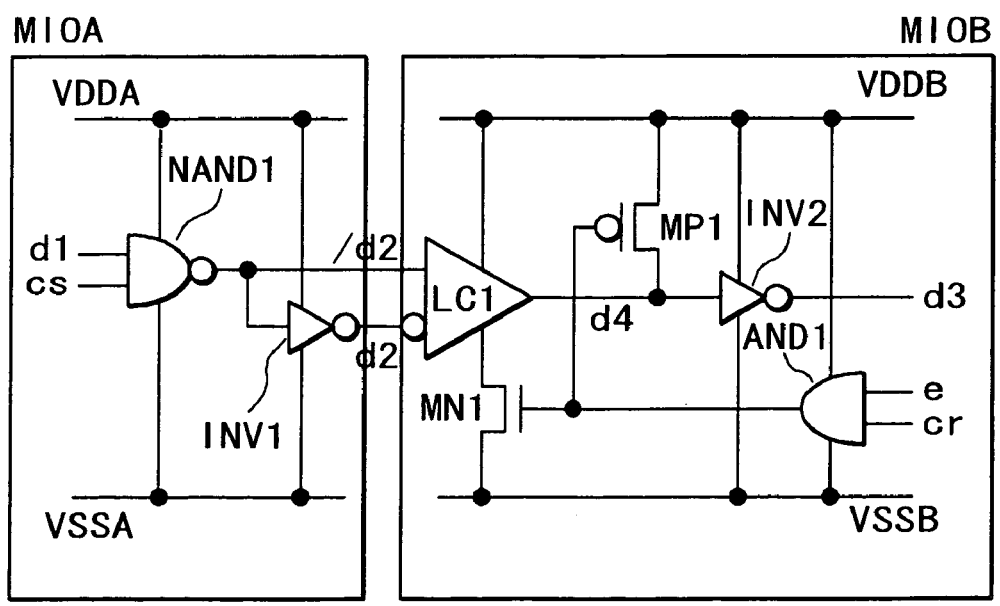
FIG. 9 is a detailed block diagram of the micro-scale I/O circuit shown in FIG. 8.

FIG. 9 shows a detailed configuration of the micro-scale. I/O circuit shown in FIG. 8. Reference symbol NAND1 denotes a 2-input NAND circuit; INV1 and INV2 denote inverter circuits; AND1 denotes a 2-input AND circuit and MP1 denotes a PMOS transistor; MN1 denotes an NMOS transistor; and LC1 denotes a level conversion circuit, which amplifies or attenuates the amplitude of the input signal (d2, /d2) so as to match the amplitude (VDDA-VSSA) with that (VDDB-VSSB) of the supply voltage of the level conversion circuit LC1 and outputs the level converted signal to a node d4. The logical level of the signal output to the node d4 is the same as that of the signal inputted as a node d2. The power potential VDDB is supplied to the level conversion circuit LC1 directly while the ground potential VSSB is supplied to the LC1 through the NMOS transistor MN1.

In the first case of power control, the NMOS transistor MN1 is turned off and the PMOS transistor MP1 is turned on when the signal e reaches the low level. Consequently, the NMOS transistor MN1 is kept off even when the signals d2 and /d2 go into the floating state respectively, thereby the level conversion circuit LC1 is prevented from a penetrating current flow. As a result, the output level of the level conversion circuit LC1 goes into the floating state while the PMOS transistor MP1 controls the logical level of the node d4 at high level. The micro-scale I/O circuit is thus operated normally.

In the second case of power control, the signal cr is driven to low level to operate the micro-scale I/O circuit. The AND circuit AND1 is thus prevented from a penetrating current flow even when the signal e goes into the floating state. In addition, because the output level of AND circuit AND1 is controlled at low level, the normal operation of the micro-scale I/O circuit is assured.

In the third case of power control, the signal cs is driven to low level to prevent the NAND circuit NAND1 from a penetrating current flow even when the signal line d1 goes into the floating state. Because the output level of NAND circuit NAND1 is controlled at high level, the micro-scale I/O circuit is assured for the normal operation.

Figure 19:
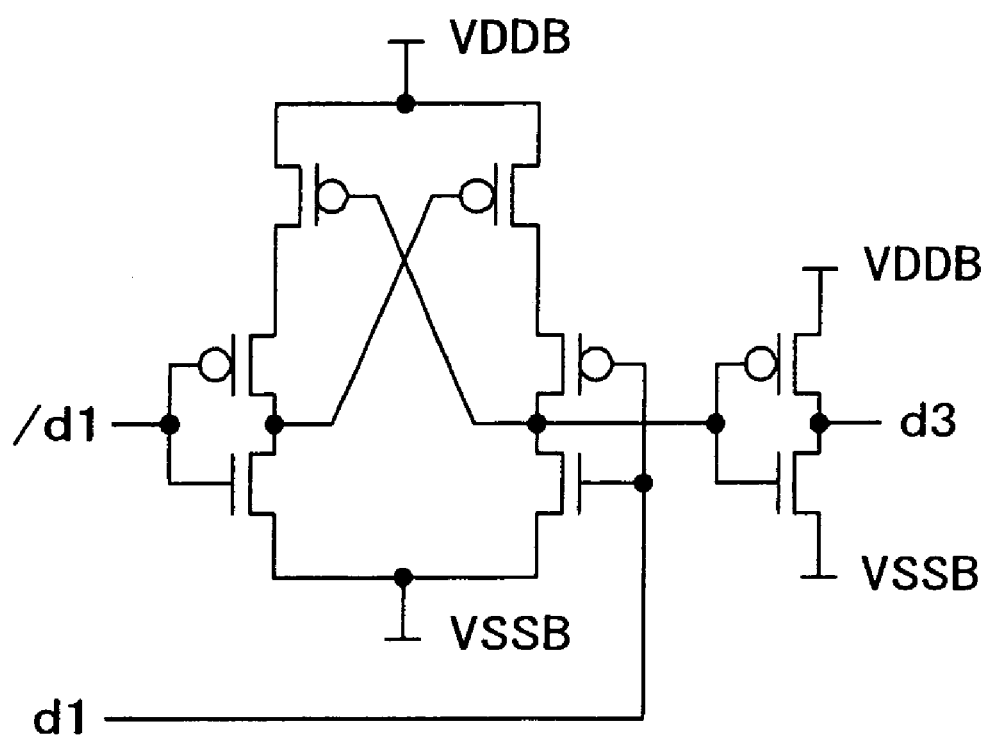
FIG. 19 is a configuration example of a level conversion circuit.

FIG. 19 shows an example of a configuration of the level conversion circuit LC1. The LC1 is a differential level conversion circuit that receives the signal d1 and a complementary signal /d1.

In the configurations shown in FIGS. 4 through 9, the circuit block BLKA uses one signal line d1 to send one bit information. So called single-ended signals are used for communications. On the other hand, when dual-rail signals are used for communications (two signal lines are used to send one bit information; the circuit block BLKA uses the signal d1 and the complementary signal /d1), the first stage of the micro-scale I/O circuit MIOA is omitted. When such dual-rail signals are used for such communications such, the logic gate level circuit is configured just like a circuit formed by deleting the first stage of the micro-scale I/O circuit MIOA from the configuration shown in FIG. 9 and inputting the signal d1 as the signal /d2 and the complementary signal /d1 as the signal d2 to the level conversion circuit LC1. In this connection, the signal line cs is omitted here.

The input/output signals shown in FIG. 9 are thus summarized as shown in FIG. 10. The "*" denotes any level including the floating level. The "–" denotes the high or low level. Each of the power supply states (ON, OFF1 and OFF2) of the sending side circuit block SND and receiving side circuit block RCV denotes the logical level of each subject signal line d1, e, cs and cr. The power supply state "ON" of a circuit block denotes a state in which potentials VDDA/VDDB and VSSA/VSSB are supplied. The power supply state "OFF1" of the circuit block denotes a state in which the potentials VDDA/VDDB and VSSA/VSSB are supplied and a power is supplied to the micro-scale I/O circuit (its first stage for the sending side circuit block SND or its second stage for the receiving side circuit block RCV) while power supply to the circuit block is shut off by such means as a power switch PSWA/PSWB. The circuit block power supply state "OFF2" denotes a state in which the VDDA/VDDB or VSSA/VSSB potential supply is shut off.

Consequently, the power supply to the subject circuit block can be shut off in any of the above first to fourth cases of power control, because the micro-scale I/O circuit can inhibit a penetrating current flow caused by a node driven into the floating state if the micro-scale I/O circuit were not provided. Accordingly, even when a non-negligible sub-threshold leakage current flows due to a small absolute threshold voltage of the MOS transistors of the circuit block and/or when a non-negligible gate tunnel leakage current flows due to the thin gate insulation film of the MOS transistors, the unnecessary power consumption increased in the subject module by a leakage current can be minimized.

The threshold voltage and the gate insulation film thickness of the MOS transistors in the subject circuit block are not limited specifically. Those of the MOS transistors of each power switch are also not limited specifically. Each power switch must obtain a comparatively large on-current and a comparatively small off-current satisfactorily by controlling the potential of its gate terminal. Accordingly, the absolute threshold voltage of the power switch is preferable to be higher than that of the MOS transistors of the circuit block. And the gate insulation film thickness of the power switch also is preferable to be thicker than that of the MOS transistors of the circuit block. The gate insulation film thickness mentioned here is an effective gate insulation film thickness to which the permittivity of the gate insulation film's material is taken into consideration.

In the configuration shown in FIG. 9, although a ground potential is supplied to the level conversion circuit LC1 through the NMOS transistor MN1, another configuration is possible. The level conversion circuit LC1 may have a configuration, in which instead of the NMOS transistor MN1, a PMOS transistor may be inserted between the power supply VDDB and the level conversion circuit LC1, and the PMOS transistor is turned off in the first case of power control.

In the configurations shown in FIGS. 6 through 8, the NMOS transistor PSWA or NMOS transistor PSWB is disposed between the subject circuit block and the ground line so that the transistor functions as a power switch between them to realize the second or third case of power control. On the other hand, a PMOS transistor may be disposed between the circuit block and the power line so that the transistor functions as a power switch between them.

All of the first to fourth cases of power control are not necessarily provided and any of them may be provided selectively in accordance with the chip or module specifications. When the first case of power control is not provided, the AND circuit AND1 may be replaced with a buffer circuit, so that the signal line cr is buffered, then inputted to the gate terminals of the NMOS transistor MN1 and the PMOS transistor MP1 directly. When the second case of power control is not provided, the AND circuit AND1 may be replaced with a buffer circuit, so that the signal line e is buffered, then inputted to the gate terminals of the NMOS transistor MN1 and the PMOS transistor MP1 directly. When the third case of power control is not provided, the NAND circuit NAND1 may be replaced with an inverter circuit, so that the signal line d1 is inverted, then inputted to the signal line /d2 directly. In addition to the above cases, the cases of power control may be combined freely.

In FIGS. 4 through 9, single-bit signals are sent or received between circuit blocks so as to make it easier to understand. Usually, however, signal lines are used to send or receive a plurality of signals between those circuit blocks. In this case, control signals e, cr, and cs are required to control the plurality of signal lines. There is no need to provide these control signals for each bit. Each circuit block can usually send and receive signals and the circuit blocks are divided into sending side ones and receiving side ones just to make it easier to understand. Further, while a differential level conversion circuit is used in FIGS. 4 through 9, it may be replaced with an inverter type level-down circuit. In addition, the level conversion circuit may be omitted if the operation voltage is the same among the circuit blocks. Each circuit can thus be modified freely according to the whole chip or module specification.

<Embodiment 2>

Figure 11A:
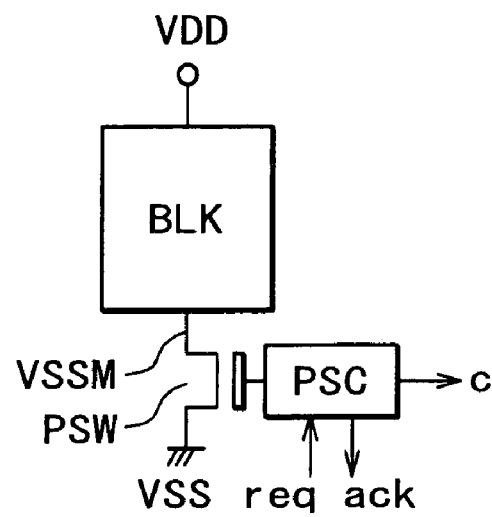
FIG. 11A is a block diagram of an interface of a power switching controller circuit.
Figure 11B:
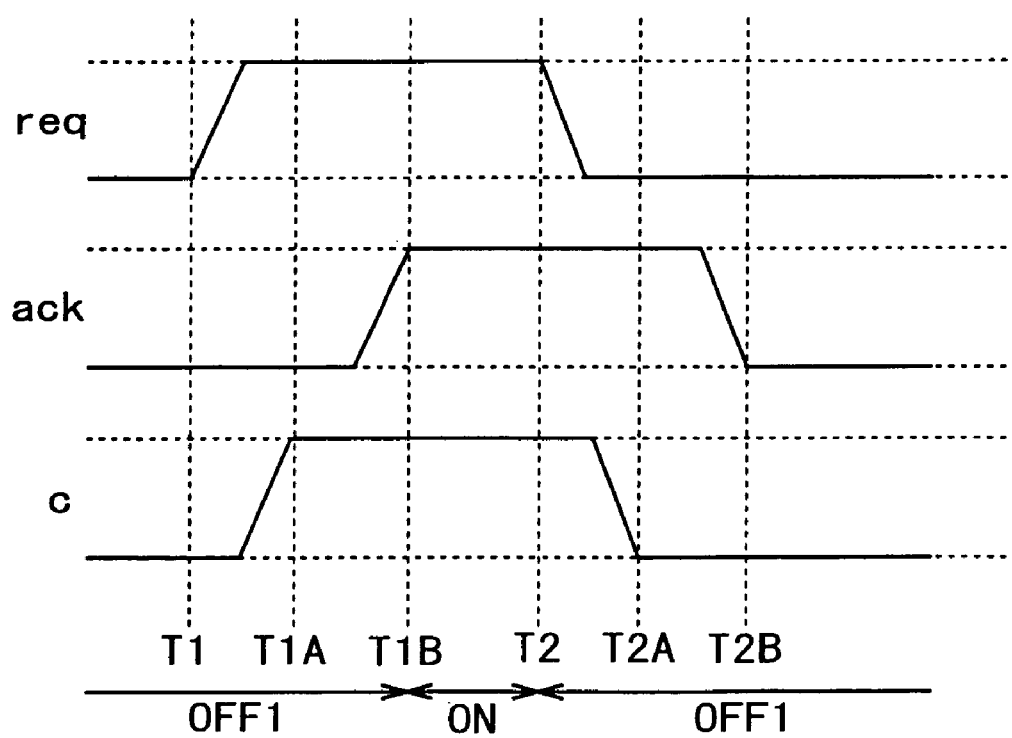
FIG. 11B is a timing diagram corresponding to FIG. 11A.

FIG. 11A shows a block diagram of an interface of a power switching controller circuit PSCA or PSCB shown in FIGS. 6 through 8. FIG. 11B is a timing diagram for FIG. 11A. A power switching controller circuit PSC for controlling the power switch PSW controls the on/off state of the power switch PSW through the hand-shaking of a request line req and an acknowledge line ack to control the power supply to each circuit block BLK. In FIGS. 11A and B, the request line req is driven high level at time T1 to turn on the power switch PSW and supply a power to the subject circuit block BLK. When the power switch PSW is turned on and the power supply to the circuit block BLK is completed, the acknowledge line ack is driven high level at time T1B to notify the subject device outside the power switching controller circuit PSC that the circuit block BLK is ready to operate. On the other hand, the request line req is driven low level at time T2 to turn off the power switch PSW and shut off the power to the circuit block BLK. When the turning off of the power switch PSW is completed, the acknowledge line ack is driven low level at time T2B to notify the subject device outside the power switching controller circuit PSC that the power to the circuit block BLK is shut off.

In FIG. 8, the power switching controller circuit outputs a power on/off state signal to the corresponding micro-scale I/O circuit through a signal line cs or cr. In the configuration shown in FIG. 11A and the timing diagram of FIG. 1B, the signal line c is equivalent to any of those signal lines cs and cr. The signal line c can establish a set state more quickly than the acknowledge line ack. For example, before the acknowledge line ack is driven high level, the signal line c is driven high level at time T1A. And, before the acknowledge line ack is driven low level, the signal line c is driven low level at time T2A. Thus, the signal line c establishes a set state more quickly than the acknowledge line ack. The communication between circuit blocks will malfunction if the micro-scale I/O circuit was not ready to operate when the circuit block BLK is ready to receive/output a signal after the power switch PSW is turned on/off. To avoid this, the signal c should be used to control the micro-scale I/O circuit so that it gets ready to operate before the acknowledge line ack is driven high level.

While each circuit block is grounded through a power switch in the above description, when no problem arises from the DC power consumption caused by a leakage current, there is no need to shut off the power supply by the power switch. This, for example, corresponds to the case where an I/O buffer includes transistors that operate at a high voltage and have a comparatively thick gate insulation film respectively. Further, some circuit blocks includes transistors having a high absolute threshold voltage respectively do not face the DC power consumption problem. In these cases, there is no need to ground each circuit block through a power switch as described above. Whether to use a power switch to shut off a power is determined by the configuration of MOS transistors in the subject circuit block and/or the characteristics of the subject circuit of the circuit block.

Nevertheless, a power switch can suppress the transmission of the noise generated in a circuit block to another through the ground. In short, grounding through the power switch prevents the transmission of the noise through the ground. This is because the power switch that functions as a resistor to form a low-pass filter with a capacitance, such as each circuit block parasitic capacitance and the ground line parasitic capacitance. For example, the circuit block BLKA is assumed to be a digital circuit that employs a high-speed operation and the circuit block BLKB is assumed to be an analog circuit as an A/D converter that employs a high precision operation.

Further, the relationship between the power supplies VDDA and VDDB is assumed to be VDDA<VDDB, since a supply voltage applied to the digital circuit is usually lower than that of the analog circuit. The grounds VSSA and VSSB are usually connected to each other in the subject chip or outside the module. In this connection, because the supply voltage differs between the power supplies VDDA and VDDB and the power supplies are separated even outside the module, very little noise generated in the power supply VDDA is transmitted to the power supply VDDB. Because the grounds VSSA and VSSB are connected to each other, however, the noise by the digital circuit is transmitted directly to the analog circuit if no power switch is provided. On the other hand, when a power switch is provided in the configuration like in FIG. 8, the noise generated by the digital circuit is attenuated by the power switch PSWA and transmitted to the grounds VSSA and VSSB. The noise in the grounds VSSA and VSSB is further attenuated by the power switch PSWB and transmitted to the virtual ground line VSSMB, which is an actual ground line of the analog circuit. Consequently, the noise coupling between the digital circuit and the analog circuit can be reduced.

<Embodiment 3>

Figure 12:
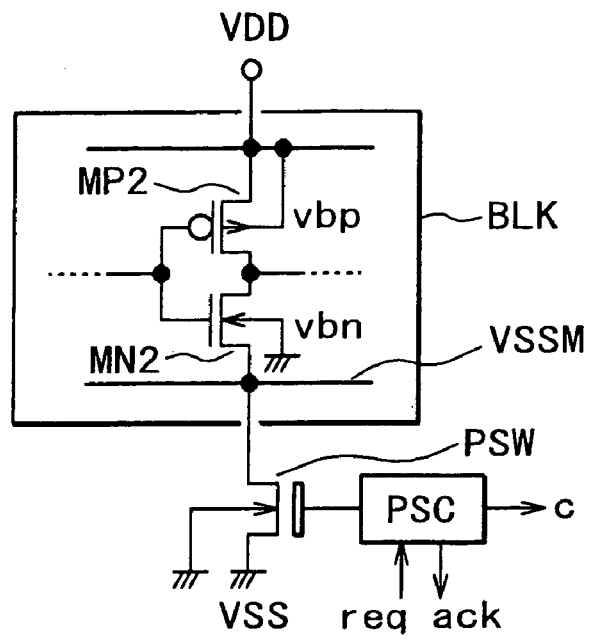
FIG. 12 illustrates connections of substrate terminals of a MOS transistor of a circuit block.

The substrate terminal (well) of each MOS transistor of a circuit block is connected according to its object characteristics in various ways. FIG. 12 shows a block diagram of a circuit block in which the substrate terminal vbp of the PMOS transistor MP2 is connected to the power supply VDD and the substrate terminal vbn of the NMOS transistor MN2 is connected to the ground VSS. Connecting the well vbn of the NMOS transistor MN2 to the ground VSS in such a way allows the potential of the virtual ground line VSSM to rise when the power switch PSW is turned off. This also allows the reversed substrate bias voltage to be applied between the source of the NMOS transistor MN2 and the substrate (well). Accordingly, the leakage current that flows through the NMOS transistor MN2 is reduced due to the substrate bias effect. Otherwise, the substrate terminal vbn may be connected to the virtual ground line VSSM. Because the well potential of the NMOS transistor MN2 and the source potential become equal, this connection is more suitable increasing the speed of the transistor operation.

Figure 13:
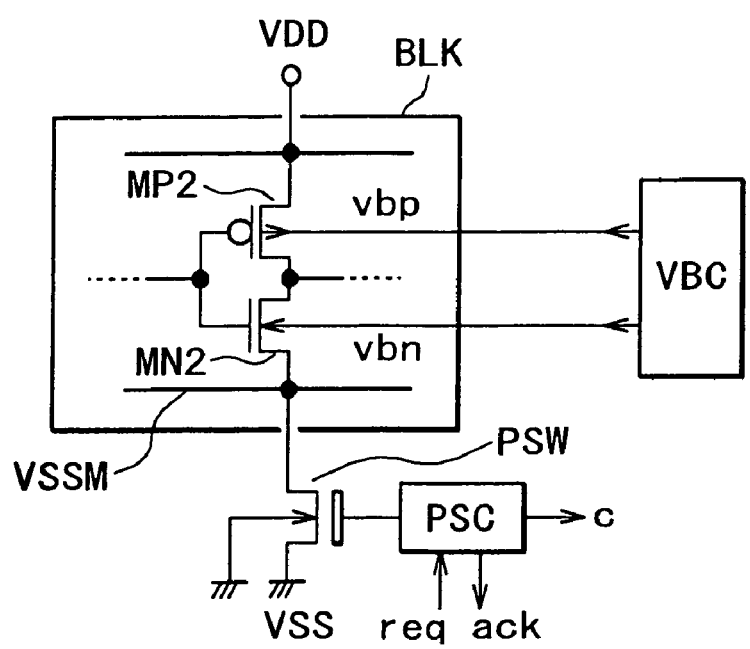
FIG. 13 illustrates other connections of the substrate terminals of a MOS transistor of a circuit block.

In the configuration shown in FIG. 13, a substrate voltage controller circuit VBC is used to control the potentials of the substrate terminal vbp of the PMOS transistor MP2 and the substrate terminal vbn of the NMOS transistor MN2 in a circuit block. Although the vbp and vbn potentials are not limited specifically, a low voltage, that is VDD or lower potential than VDD, may be applied to the well vbp and a high voltage, that is VSS or higher potential than VSS, may be applied to the well vbn to increase the speed of the circuit block BLK operation. In addition, an optimal potential may also be applied to both wells vbp and vbn according to the operation speed required for the circuit block BLK. In particular, determining the potentials to be applied to both vbp and vbn according to the process, temperature, or supply voltage of the circuit block can compensate for the process variation or the temperature/supply voltage variation.

Note that while a configuration of the inverter circuit in the circuit block BLK is shown in FIGS. 12 and 13, it is just a typical example of the CMOS logic circuit, and the configuration can be applied to various other circuits.

<Embodiment 4>

Figure 14:
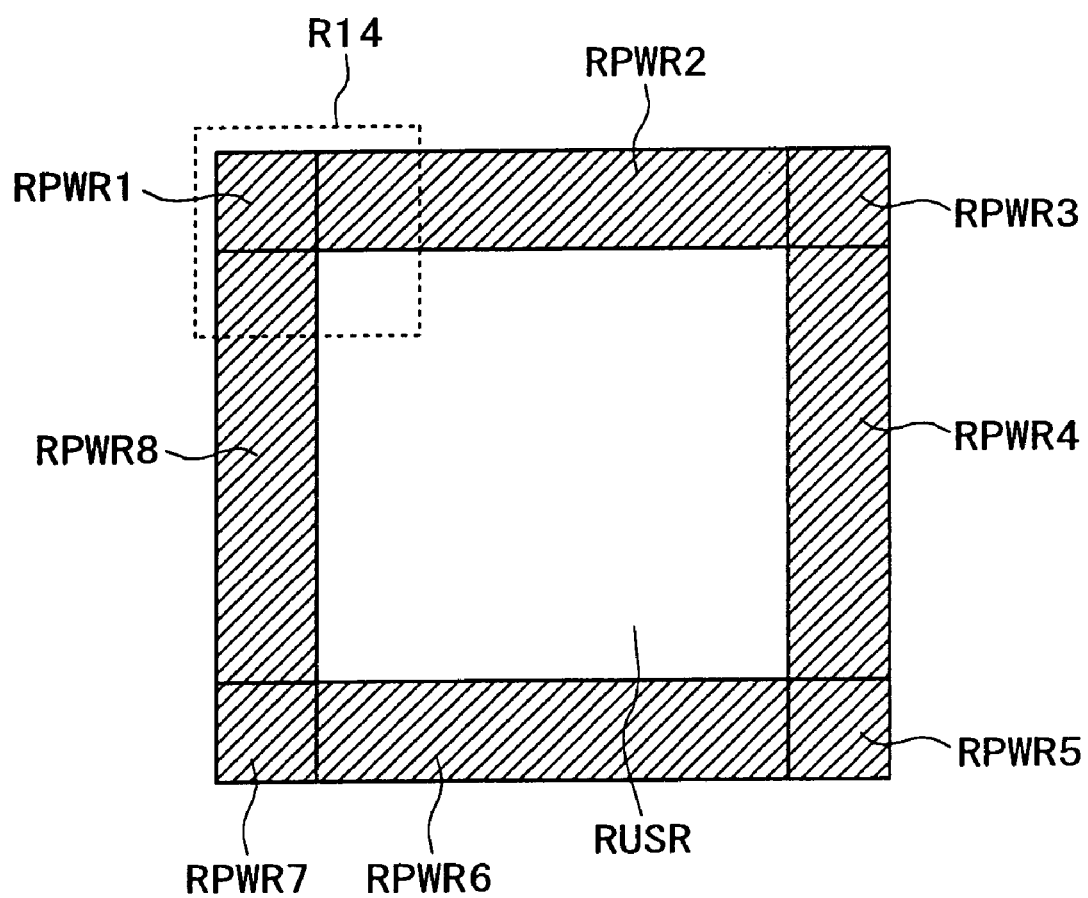
FIG. 14 is a layout (floor plan) of a circuit block.

A circuit block layout will now be described. FIG. 14 shows a layout of the circuit block BLK shown in FIG. 12. RUSR denotes a circuit block BLK area in which MOS transistors are disposed. A ring-like area is formed by areas RPWR1 to RPWR8 where power supply rings correspond to power supply lines such as the power line VDD, the ground line VSS, the virtual ground line VSSM, etc. shown in FIG.

12 are disposed. Comparatively wide wires form these power supply rings. Consequently, the power line, the ground line and the virtual ground line connected to the MOS transistors in the circuit block have low resistance, respectively.

The power switches PSW should preferably be disposed in each of the four side areas, that is areas RPWR2, RPWR4, RPWR6 and RPWR8, of the ring-like area respectively. In particular, the power switches PSW should desirably be disposed in the areas RPWR4 and RPWR8 respectively. As shown in FIG. 15, the power line VDD105(M1) and the virtual ground line VSSM105(M1) for the standard cell CELL of the circuit block are extended horizontally. This allows a power switches PSW disposed in each of the areas RPWR4 and RPWR8 to reduce the influence from the wiring resistance. On the other hand, the power switches PSW disposed in each of the areas RPWR2 and RPWR6 increases the influence from the wiring resistance of the virtual power line and the virtual ground line disposed in each of the areas RPWR4 and RPWR8. The power switches PSW should be desirably disposed in the areas RPWR4 and RPWR8 by priority, therefore, then additional power switches PSW should be disposed in the areas RPWR2 and RPWR6 to reduce the influence further from the on-resistance of the power switches PSW. The power switching controller circuit PSC shown in FIG. 12 and the substrate bias controller circuit VBC shown in FIG. 13 may be disposed in some of the four corner areas of the ring-like area, that is at least one of areas RPWR1, RPWR3, RPWR5 or RPWR7. The larger the scale of the circuit block, the larger the size occupied by the circuit block. This means that the sizes of the areas RPWR2, RPWR4, RPWR6 and RPWR8 also expand. Accordingly, the power switches PSW can thus be disposed so that the gate width of the power switches PSW satisfies the scale of the subject circuit block. On the other hand, the sizes of the areas RPWR1, RPWR3, RPWR5 and RPWR7 can be determined independently of the size occupied by the subject circuit block. Also in this connection, the power switching controller circuit PSC and the substrate bias controller circuit VBC shown in FIG. 13 should desirably be disposed in each of the four corner areas of the ring-like area.

FIG. 15 shows an expanded view of the portion R14 shown in FIG. 14, in which the power line VDD, the ground line VSS and the virtual ground line VSSM are disposed. VDD100 to VDD110 denote power lines, VSS101 to VSS103, as well as VSS107 to VSS113 denote ground lines and VSSM101 to VSSM107 denote virtual ground lines. SIG100 denotes one of the lines crossing the power supply ring vertically. SIG101 denotes one of the lines crossing the power supply ring horizontally. The symbols M1 to M4 described in the parentheses following each symbol in FIG. 15 denote a wiring layer used to dispose the line. A plurality of symbols denote that lines are disposed in a plurality of wiring layers. Layer M4 is disposed above layer M3, layer M3 is disposed above layer M2, and layer M2 is above layer M1. A square with symbol x denotes via hole for connecting each wiring layer. Portion RPWP denotes the ring-like area for power supply rings. Portion RUSR denotes an area in which MOS transistors of the subject circuit block are disposed.

The power supply rings include lines VDD101 to VDD103, VSS101 to VSS103, VSSM101 to VSSM103 and VSS111 to VSS113 in the wiring layers M2 to M4, which are comparatively upper layers from the semiconductor substrate. Because upper wiring layers enable wiring pitches to be secured more widely, upper wiring layers can be formed more thickly; thereby the sheet resistances of wirings can be reduced in size and low resistance wirings are realized. Such low resistance wirings in the power supply rings make it possible to form the power supply ring with low resistance, thereby the so-called voltage drop is suppressed.

In FIG. 15, a vertical power line RPWRV that shunts the power supply rings is formed vertically with both lines VDD106 and VSSM106. A horizontal power line RPWRH that shunts the power supply rings is formed horizontally with lines VDD107, VSS107 and VSSM107. Consequently, the power supply ring functions as a further low resistor. Although the vertical disposition pitches of the vertical power lines RPWRV and the vertical disposition pitches of the horizontal power supply lines RPWRH are not limited specifically. The number of channels for wiring signal lines of the MOS transistors of a circuit block is reduced if the vertical power supply lines RPWRV were disposed excessively, because both vertical power supply lines RPWRV and many signal lines should be disposed in the wiring layer M2. To avoid this, therefore, the vertical power lines RPWRV should be appropriately disposed at about 100 μm pitches. Incidentally, the comparatively upper wiring layer M4 is used for disposing the horizontal power supply lines RPWRH, there is little possibility to reduce the number of channels for wiring the signal lines. So, many horizontal power supply lines RPWRH can be disposed.

The power supply lines RCELL include lines VDD105 and VSSM105 formed in the wiring layer M1, which supplies supply voltage from the power supply ring to the MOS transistors of each circuit block. When many standard cells CELL100 are disposed side by side to configure a circuit, the power supply lines RCELL are disposed vertically at the same disposition pitches as those of the standard cells CELL100 so that a power is supplied to all the standard cells CELL100. Channels used for wiring signal lines of the MOS transistors of the circuit block are usually disposed in the wiring layers M1 to M3. Similarly, in the four corner areas of the ring-like area, the power and ground lines are disposed in the wiring layer M4; no lower wiring layers are used. When the power switching controller circuit PSC or the substrate bias controller circuit VBC are provided, a sufficient number of wiring layers M1 to M3 are used to configure the target circuit. When none of the circuits PSC and VBC is used, those wiring layers can be used for the power and ground lines.

Lines VDD109, VDD110, VSS109 and VSS110 are used to supply powers and ground potentials to the power supply ring from external power supply ring. Because the wiring layers M4 and M1 are used for the above supply lines, the wiring layers M2 and M3 can be used for wiring signal lines between each circuit block and the micro-scale I/O circuit such as lines SIG100 and SIG101.

While only one line VDD108 for connecting line VDD100 to line VDD103 electrically is shown in FIG. 15 to make it simplify the description, many lines VDD108 should actually be disposed at certain pitches to reduce the connection resistance. Although no vertical electrical connection of the lines VDD100 and VDD101 is shown in FIG. 15, they should desirably be wired in the wiring layer M2 just like the line VDD108. While only one line VSS108 for connecting line VSS103 to line VSS113 is shown in FIG. 15 to make it simplify the description, many lines VSS108 should actually be disposed at certain pitches to reduce the connection resistance. While vertical electrical connection of the lines VSS101 and VSSl11 is not shown in FIG. 15, the lines VSS101 and VSS111 should desirably be disposed in the wiring layer M3 just like the line VSS108.

The above layout thus makes it possible to use wiring layers efficiently to supply a low impedance power to the standard cells CELL100. Although FIG. 15 shows a configuration including four wiring layers, more wiring layers may be included. In this connection, the more wiring layers can be used in the configuration shown in FIG. 15 to configure a lower resistance power supply ring. Although how to use those wiring layers concretely is not limited, the top wiring layer (layer M4 in FIG. 15) and the bottom wiring layer (layer M1 in FIG. 15) should be used to supply both power and ground potential to the power supply ring from external, because many wiring layers can thus be used efficiently to dispose signal lines between each circuit block and its micro-scale I/O circuit. In addition, the horizontal power supply lines RPWRH should be disposed in the top wiring layer (layer M4 in FIG. 15). This is because many channels for wiring signal lines of the MOS transistors in the subject circuit block can be secured.

<Embodiment 5>

Figure 16:
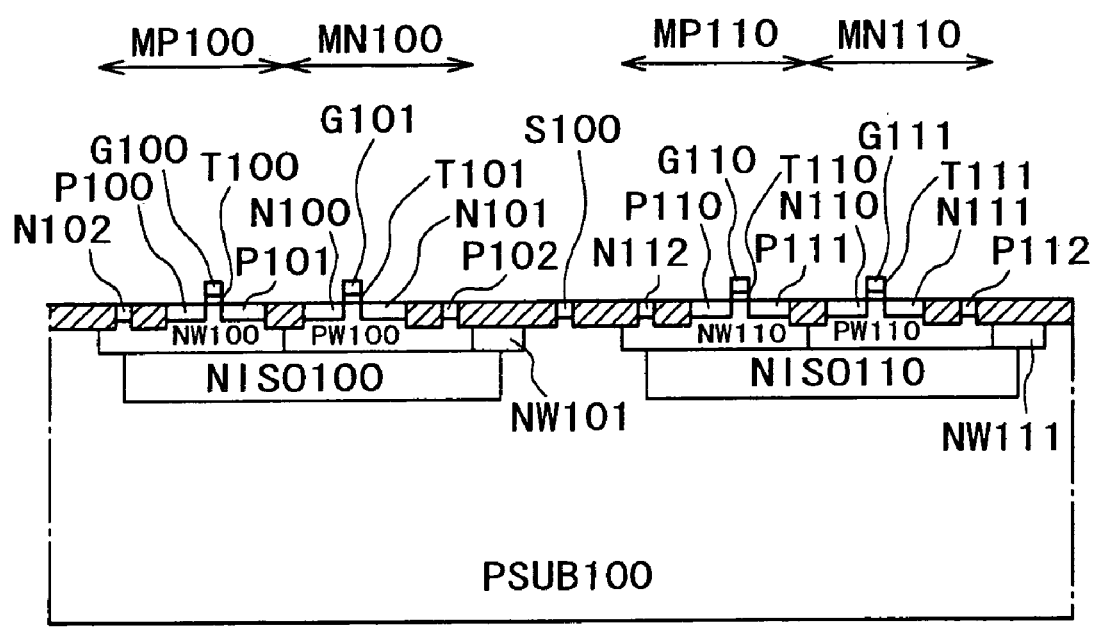
FIG. 16 is a cross sectional view of a circuit block and a micro-scale I/O circuit.

FIG. 16 shows a cross sectional view of a chip of the present invention. PSUB100 denotes a P-type substrate. NW100 and NW110 denote N-type wells. PW100 and PW110 denote P-type wells. NISO100 and NISO110 denote impurity layers formed more deeply than the wells NW100 and NW110, that is, so-called deep N-type wells used to configure a triple well structure. P100 and P101 denote P-type diffusion layers, which form a PMOS transistor MP100 with a gate electrode G100 and a gate insulation film T100. P110 and P111 are also P-type diffusion layers, which form a PMOS transistor MP110 with a gate electrode G110 and a gate insulation film T110. N100 and N101 denote N-type diffusion layers, which form an NMOS transistor MN100 with a gate electrode G101 and a gate insulation film T101. N110 and N111 are also N-type diffusion layers, which form an NMOS transistor MN110 with a gate electrode G111 and a gate insulation film T111. N102 denotes an N-type diffusion layer; it is a substrate terminal of the PMOS transistor MP100 used to supply a potential to the N-type well NW100. P102 denotes a P-type diffusion layer; it is a substrate terminal of the NMOS transistor MN100 used to supply a potential to the P-type well PW100. N112 denotes an N-type diffusion layer; it is a substrate terminal of the PMOS transistor MP110 used to supply a potential to the N-type well NW110. P112 denotes a P-type diffusion layer; it is a substrate terminal of the NMOS transistor MN110 used to supply a potential to the P-type well PW110. S100 denotes a P-type diffusion layer from which a potential is supplied to the PSUB100.

The employment of the triple well structure makes it possible to set the power supply potential and the ground potential independently of each other in each circuit block. For example, in the configuration shown in FIG. 4, MOS transistors MP100 and MN100 of the circuit block BLKA are formed on a deep N-type well NISO100 respectively. MOS transistors MP100 and MN110 of the circuit block BLKB are formed on a deep N-type well NISO110 respectively. Because the substrate potential of MOS transistors can be set in each circuit block independently of those in other circuit blocks, the configuration shown in FIG. 13 is realized.

Figure 17:
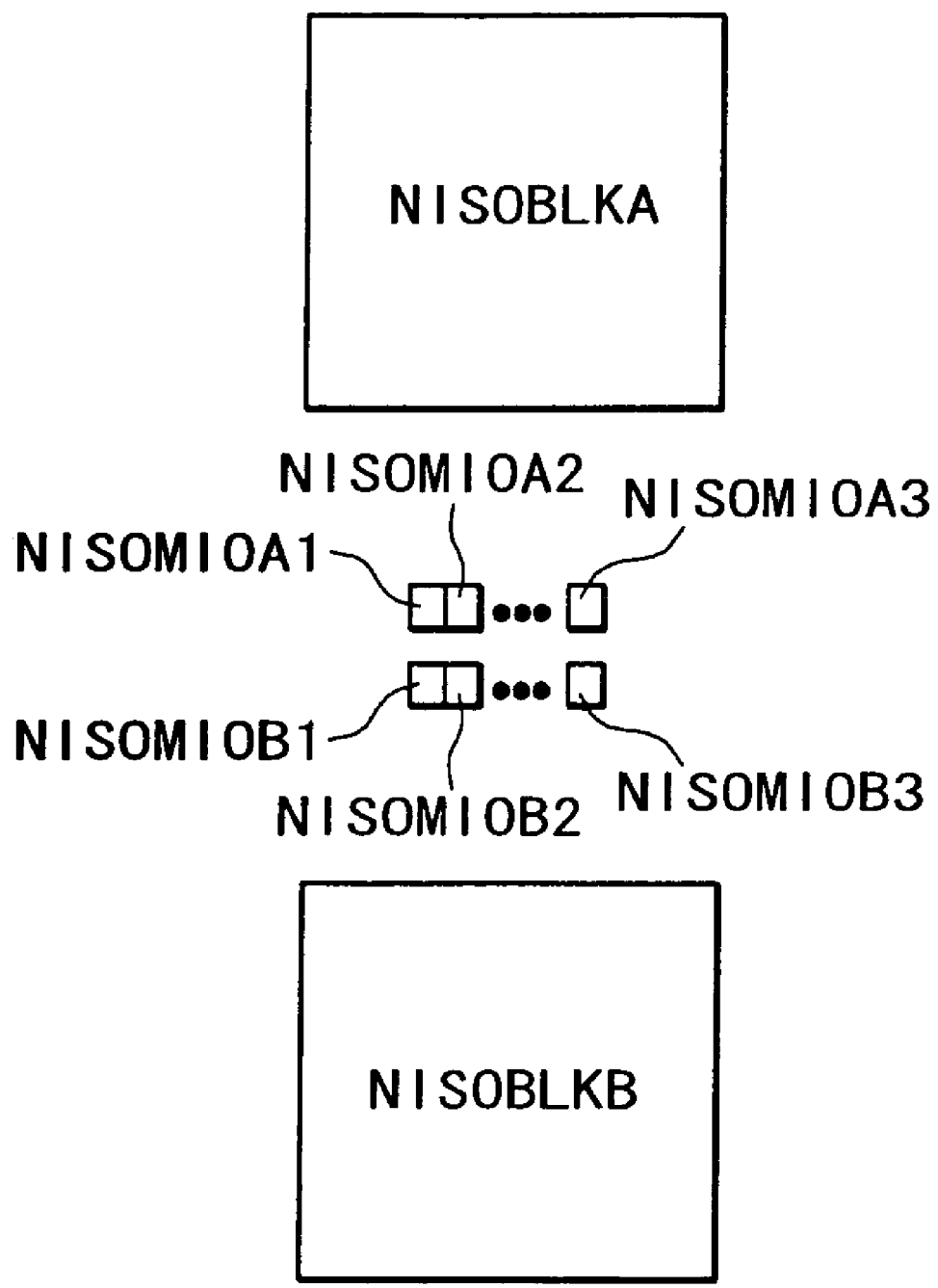
FIG. 17 is a layout (floor plan) of deep N-type wells of circuit blocks and a micro-scale I/O circuit.

FIG. 17 shows a layout example of the configuration shown in FIG. 4. In order to simplify the description, FIG. 17 shows only the layout of the deep N-type well shown in FIG. 16. NISOBLKA denotes a deep N-type well of the circuit block BLKA. NISOBLKB denotes a deep N-type well of the circuit block BLKB. NISOMIOAL to NISO-MIOA3 denote deep N-type wells of the first stage of micro-scale I/O circuit MIOA. NISOMIOB1 to NISO-MIOB3 denote deep N-type wells of the second stage of micro-scale I/O circuit MIOB. The deep N-type well NISOBLKA has the same potential (VDDA) as that of the deep N-type wells NISOMIOA1 to NISOMIOA3, so that those wells can be connected to each other. The deep N-type well NISOBLKB has the same potential (VDDB) as that of the deep N-type wells NISOMIOB1 to NISOMIOB3, so that those wells can be connected to each other. The P-type diffusion layer S100 may be formed between the deep N-type well NISOMIOA1 to NISOMIOA3 and the deep N-type well NISOMIOB1 to NISOMIOB3. This reduces the mutual interference of the noise generated in the circuit blocks BLKA and BLKB.

<Embodiment 6>

Figure 18:
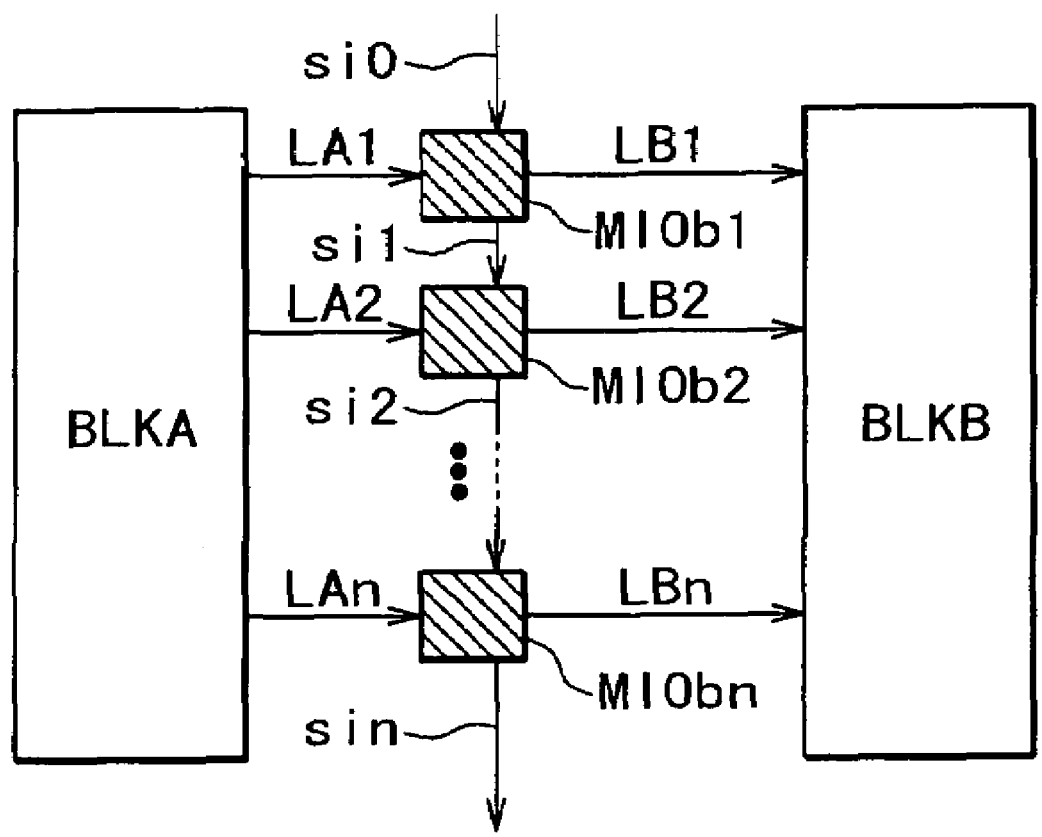
FIG. 18 is a basic block diagram of the semiconductor integrated circuit device of the present invention, which includes micro-scale I/O circuits provided with a scanning function respectively.

FIG. 18 shows a configuration of the micro-scale I/O circuit of the present invention, provided with a scanning function. This configuration aims to test the subject circuit block easily. In FIG. 18, BLKA denotes a sending side circuit block and BLKB denotes a receiving side circuit block. MIOb1 to MIObn denote respective one bits of micro-scale I/O circuit. LA1 to LAn denote respective input signals to the micro-scale I/O circuit. LB1 to LBn denote output signals from the micro-scale I/O circuit. In order to simplify the description, such control signals cr, cs, e, etc., as well as power related connections as shown in FIG. 8 are omitted here. A scanned data input is denoted by siϕ. The data is shifted sequentially in order of si1, si2, sin, . . . .

Generally, a flip-flop (FF) is scanned when its inside state is to be set forcibly from outside the subject chip. In this case, the input data from the si0 is used forcibly to set the outputs LB1 to LBn of the subject micro-scale I/O circuit; the inputs LA1 to LAn to the micro-scale I/O circuit are neglected here. Although the concrete configuration of the micro-scale I/O circuit is omitted here, the configuration is realized, for example, by providing a flip-flop the micro-scale I/O circuit and a plurality of micro-scale I/O circuits are connected to form a shift register. Using this scanning path makes it possible to output the values of the inputs LA1 to LAn to sin sequentially in order of LAn to LA1. With use of the scanning function provided for each micro-scale I/O circuit, the function tests of each circuit block can be executed easily and quickly.

While the preferred embodiments of the present invention have been described concretely, it is to be understood that modifications will be apparent to those skilled in the art without departing from the spirit of the present invention.

The present invention can thus obtain the following effects. The number of man-hours required for the development of each chip or module can be reduced. Circuit modification to be required by a change of a fabrication process can be minimized. The optimized power supply can be supplied to each circuit block, thereby the device operation speed is increased and the device power consumption is reduced at the same time. Power supply to each circuit block can be shut off by various means when the circuit block is idle, thereby unnecessary power consumption caused by a leakage current is reduced.

While the present invention has been described above in connection with the preferred embodiments, one of ordinary skill in the art would be motivated by this disclosure to make various modifications and still be within the scope and spirit of the present invention as recited in the appended claims.

What is claimed is:

1. A semiconductor integrated circuit device, comprising:
a first area having a first side extending in a first direction and a second side extending in a second direction that crosses the first direction, the first area having formed thereon a first MOS transistor of a circuit block;
a second area having a third side extending in the first direction and a fourth side extending in the second direction, the second area being disposed so that the third side is adjacent to the first side;
a third area having a fifth side extending in the first direction and a sixth side extending in the second direction, the third area being disposed so that the sixth side is adjacent to the second side; and
a fourth area having a seventh side extending in the first direction and an eighth side extending in the second direction, the fourth area being disposed so that the seventh side is adjacent to the fifth side and the eighth side is adjacent to the fourth side,
wherein first, second and third power lines are disposed in wiring layers of the second to fourth areas, the first, second and third power lines being in a ring shape surrounding the first area,
wherein fourth and fifth power lines disposed in the lowest wiring layer of the first area are extended in the second direction, the fourth and fifth power lines applying a supply voltage to the first MOS transistor,
wherein the first and fourth power lines are connected to each other electrically,
wherein the third and fifth power lines are connected to each other electrically,
wherein the second and third power lines are connected to each other through a plurality of second MOS transistors, and
wherein the plurality of second MOS transistors are disposed in the second area.

2. The semiconductor integrated circuit device according to claim 1, wherein the plurality of second MOS transistors are disposed in the third area.

3. The semiconductor integrated circuit device according to claim 1, wherein a controlling circuit is provided in the fourth area, the controlling circuit controlling the ON/OFF state of the second MOS transistor.

* * * * *